United States Patent
Marques Martins et al.

(10) Patent No.: US 10,897,247 B2
(45) Date of Patent: Jan. 19, 2021

(54) INTELLIGENT SEMICONDUCTOR SWITCH

(71) Applicant: Infineon Technologies AG, Neubiberg (DE)

(72) Inventors: Carlos Joao Marques Martins, Munich (DE); Markus Bader, Merching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/775,182

(22) Filed: Jan. 28, 2020

(65) Prior Publication Data
US 2020/0252061 A1    Aug. 6, 2020

(30) Foreign Application Priority Data
Feb. 6, 2019   (DE) .................. 10 2019 102 929

(51) Int. Cl.
*H03K 17/00*   (2006.01)
*H03K 17/082*  (2006.01)
(Continued)

(52) U.S. Cl.
CPC ......... *H03K 17/0822* (2013.01); *G05B 19/04* (2013.01); *H02M 1/08* (2013.01);
(Continued)

(58) Field of Classification Search
CPC ........ H03K 17/18; H03K 17/28; H03K 17/56; H03K 19/94; H03K 2017/0806; H03K 2217/0027
See application file for complete search history.

(56) References Cited

U.S. PATENT DOCUMENTS 6,144,085 A    11/2000 Barker
7,279,765 B2 * 10/2007 Ahn .................... G02F 1/13439
                                                          216/6

(Continued)

FOREIGN PATENT DOCUMENTS

DE    102004063946 A1   3/2006
DE    102016100498 A1   7/2016
(Continued)

OTHER PUBLICATIONS

Office Action, in the German language, from counterpart German Application No. 102019102929.5, dated Oct. 23, 2019, 5 pp.
(Continued)

*Primary Examiner* — Dinh T Le
(74) *Attorney, Agent, or Firm* — Shumaker & Sieffert, P.A.

(57) ABSTRACT

A description is given below of an intelligent semiconductor switch and also a method for operating an intelligent semiconductor switch integrated in a chip package. In accordance with one exemplary embodiment, the method comprises, in a first mode, in which a state control signal having a first logic level is received at a control terminal of the chip package, driving a first and a second semiconductor switch of a half-bridge in accordance with an input signal received at an input terminal of the chip package. In a second mode, in which a state control signal having a second logic level is received at the control terminal of the chip package, the method comprises setting an operating parameter depending on a pulse pastern of the input signal received at the input terminal.

9 Claims, 5 Drawing Sheets

(51) Int. Cl.
*G05B 19/04* (2006.01)
*H02M 1/08* (2006.01)
*H02M 7/5387* (2007.01)
*H02P 27/08* (2006.01)
*H03K 17/18* (2006.01)
*H03K 17/28* (2006.01)
*H03K 17/56* (2006.01)
*H03K 17/94* (2006.01)
*H03K 17/693* (2006.01)
*H03K 17/08* (2006.01)

(52) U.S. Cl.
CPC .......... *H02M 7/5387* (2013.01); *H02P 27/08* (2013.01); *H03K 17/18* (2013.01); *H03K 17/28* (2013.01); *H03K 17/56* (2013.01); *H03K 17/693* (2013.01); *H03K 17/94* (2013.01); *H03K 2017/0806* (2013.01); *H03K 2217/0027* (2013.01)

(56) References Cited

U.S. PATENT DOCUMENTS

| | | | |
|---|---|---|---|
| 7,489,855 B2 | 2/2009 | Kraus | |
| 9,413,352 B2 * | 8/2016 | Lim | H03K 17/785 |
| 9,672,201 B1 * | 6/2017 | Uszkoreit | G06F 40/205 |
| 9,887,532 B2 | 2/2018 | Djelassi et al. | |
| 10,305,363 B1 * | 5/2019 | Chen | H02M 1/08 |
| 2002/0024376 A1 | 2/2002 | Sander | |
| 2005/0184715 A1 | 8/2005 | Kidokoro et al. | |
| 2005/0270869 A1 | 12/2005 | Krischke et al. | |
| 2007/0008744 A1 * | 1/2007 | Heo | H02M 3/3376 363/17 |
| 2012/0194119 A1 * | 8/2012 | Kroeze | H02M 7/538 318/503 |
| 2013/0301175 A1 | 11/2013 | Posat | |
| 2014/0078629 A1 | 3/2014 | Cortigiani et al. | |
| 2014/0091384 A1 | 4/2014 | Petruzzi et al. | |
| 2017/0063077 A1 | 3/2017 | Donath et al. | |
| 2017/0294772 A1 | 10/2017 | Illing et al. | |
| 2017/0294918 A1 | 10/2017 | Illing et al. | |
| 2017/0294922 A1 | 10/2017 | Illing et al. | |
| 2017/0366116 A1 | 12/2017 | Ogawa et al. | |
| 2018/0287365 A1 | 10/2018 | Djelassi-Tscheck et al. | |
| 2020/0021207 A1 * | 1/2020 | Donat | H02M 7/5387 |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technoliges AG, "BTN8962TA High Current PN Half Bridge NovalithIC," Data Sheet, Rev. 1.0, May 17, 2013, 26 pp.
Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).
International Standard ISO 7637-2, Third Edition, Mar. 1, 2011, entitled "Road vehicles—Electrical disturbances from conduction and coupling—Part 2: Electrical transient conduction along supply lines only," 48 pp.
International Standard ISO 26262-1, Second Edition, Dec. 2018, entitled "Road vehicles—Functional safety—Part 1: Vocabulary," 42 pp.

* cited by examiner

INTELLIGENT SEMICONDUCTOR SWITCH

This Application claims priority to German Application Number 10 2019 102 929.5, filed on Feb. 6, 2019, the entire content of which is incorporated herein by reference.

TECHNICAL FIELD

The present description relates to the field of semiconductor switches with an integrated driver circuit for driving the semiconductor switches. Semiconductor products of this type are generally also referred to as intelligent semiconductor switches.

BACKGROUND

There are a multiplicity of semiconductor products that are generally referred to as intelligent semiconductor switches. An intelligent semiconductor switch usually comprises transistors (e.g. MOSFETs) and suitable driver switches for driving the transistors in a chip package. An externally generated binary control signal (logic signal) is usually fed to the driver circuit via a pin and signals to the driver circuit whether one or a plurality of transistors are intended to be switched on or off. In the case of a plurality of transistors, a plurality of control signals can be used as well.

The driver circuits in an intelligent semiconductor switch can also comprise various sensors for measuring operating parameters (e.g. load current, temperature, etc.) and circuits for detecting operating states (e.g. undervoltage detection, overtemperature, etc.). Furthermore, a driver circuit of an intelligent semiconductor switch can afford the possibility of setting certain parameters such as e.g. the switching rates (slew rate). Some intelligent semiconductor switches afford e.g. the possibility of connecting a resistor to a pin of the intelligent semiconductor switch, wherein the resistance value of the resistor defines one or a plurality of parameters used by the driver circuit. Alternatively, a parameter used by the driver circuit can be defined by the level of a signal that is fed to a pin. In cases in which a plurality of parameters are intended to be set, a separate pin is necessary for each parameter, which increases the costs overall. In particular, chip packages having many pins are more expensive than chip packages having fewer pins.

SUMMARY

A description is given below of a semiconductor component and also a method for operating an intelligent semiconductor switch integrated in a chip package. In accordance with one exemplary embodiment, the method comprises, in a first mode, in which a state control signal having a first logic level is received at a control terminal of the chip package, driving a first and a second semiconductor switch of a half-bridge in accordance with an input signal received at an input terminal of the chip package. In a second mode, in which a state control signal having a second logic level is received at the control terminal of the chip package, the method comprises setting an operating parameter depending on a pulse pastern of the input signal received at the input terminal.

In accordance with one exemplary embodiment, the semiconductor component comprises the following: a half-bridge having a first semiconductor switch and a second semiconductor switch, which are both connected to a half-bridge output node, a logic circuit configured to provide control signals for the first and second semiconductor switches; an output terminal connected to the half-bridge output node; a control terminal for receiving a state control signal and an input terminal for receiving an input signal. The logic circuit is configured, in a first mode, in which the state control signal has a first logic level, to generate the control signals for the first and second semiconductor switches in accordance with the input signal, and, in a second mode, in which the state control signal has a second logic level, to set an operating parameter of the semiconductor component depending on a pulse pattern of an input signal received at the input terminal.

BRIEF DESCRIPTION OF THE DRAWINGS

Exemplary embodiments are explained in greater detail below with reference to figures. The illustrations are not necessarily true to scale and the exemplary embodiments are not just restricted to the aspects illustrated. Rather, importance is attached to illustrating the principles underlying the exemplary embodiments. In the figures.

DETAILED DESCRIPTION

Figure 1:
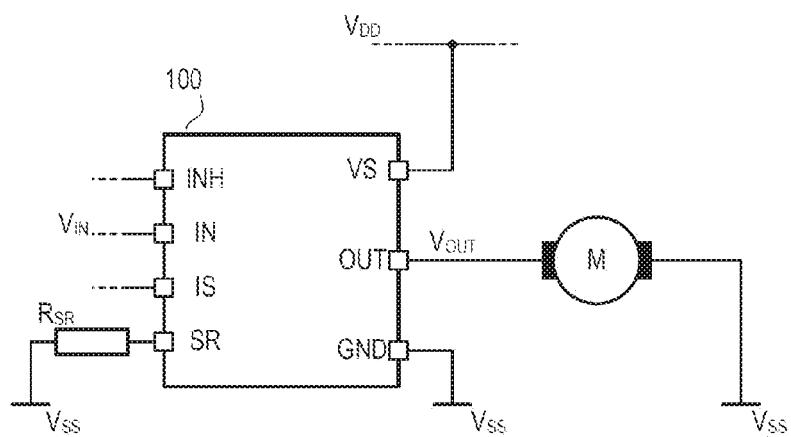
FIG. 1 illustrates one exemplary application in which an intelligent semiconductor switch is used for driving an electric motor.

FIG. 1 illustrates one exemplary application of an intelligent semiconductor switch 100 in the field of motor control. In accordance with FIG. 1, the intelligent semiconductor switch 100 is integrated in a chip package having seven pins (VS, OUT, GND, INH, IN, IS and SR). The pin OUT serves as output terminal of the intelligent semiconductor switch 100, which is connected to a first terminal of a load (electric motor M). A further terminal of the load can be connected to a reference potential, which can be defined for example by a first supply potential $V_{SS}$ (e.g. ground potential). The first (low) supply potential $V_{SS}$ and a second (high) supply potential $V_{DD}$ are fed to the intelligent semiconductor switch 100 at the supply pins GND and respectively VS (supply terminals).

The intelligent semiconductor switch 100 furthermore has a plurality of control pins. The input pin IN (input terminal) is configured to receive an (e.g. binary) control signal $V_{IN}$. The control signal $V_{IN}$ indicates to the intelligent semiconductor switch 100 whether the first supply potential $V_{SS}$ or the second supply potential $V_{DD}$ is intended to be output at the output pin OUT (disregarding low internal voltage drops). By way of example, the control signal $V_{IN}$ can be a pulse-width-modulated signal, which would cause the intelligent semiconductor switch 100 to drive the electric motor M with a pulse-width-modulated voltage $V_{OUT}$. The pins VS, OUT and GND can substantially be the three terminals of a transistor half-bridge, wherein the pin OUT constitutes the half-bridge output (also see FIG. 2 or FIG. 3).

In the example illustrated, the intelligent semiconductor switch 100 comprises an inhibit pin INH configured to receive a further control signal (inhibit signal), the level (low or high level) of which indicates to the intelligent semiconductor switch 100 to prevent the outputting of a voltage $V_{OUT}$ at the output pin OUT. In this "inhibited" state, the output pin OUT can be connected to the supply potentials $V_{DD}$, $V_{SS}$ via a high-impedance voltage path and the voltage $V_{OUT}$ at the output OUT is substantially determined by the load.

The pin IS substantially serves for outputting measured information such as e.g. a measurement signal representing the load current, or a temperature measurement signal. The measured information can be received e.g. by an external controller circuit and be taken into account in the generation of the control signal $V_{IN}$. In many applications it is desirable to set specific operating parameters such as e.g. the slew rate and thus the rise and fall times during the switchover of the output voltage $V_{OUT}$. In the present example, an operating parameter of the intelligent semiconductor switch, such as e.g. the slew rate, can be set in accordance with a selection signal present at the further pin SR. The selection signal present at the pin SR can be generated e.g. by virtue of a defined resistor $R_{SR}$ being connected to the pin SR. The intelligent semiconductor switch can feed a defined current $i_{SR}$ into the resistor (also see FIG. 2), as a result of which a voltage level $V_{SR}=i_{SR} \cdot R_{SR}$ is generated at the pin SR. In this example, the voltage level $V_{SR}$ determines the slew rate. In the case of intelligent semiconductor switches that are customary nowadays, separate pins are required for the setting of operating parameters. In the example from FIG. 1, that is the pin SR for setting the slew rate. Other examples of operating parameters of the intelligent semiconductor switch are an overcurrent limit (for turning off the intelligent semiconductor switch in the case of a short circuit) or a temperature threshold value (for turning off the intelligent semiconductor switch in the case of an overtemperature).

Figure 2:
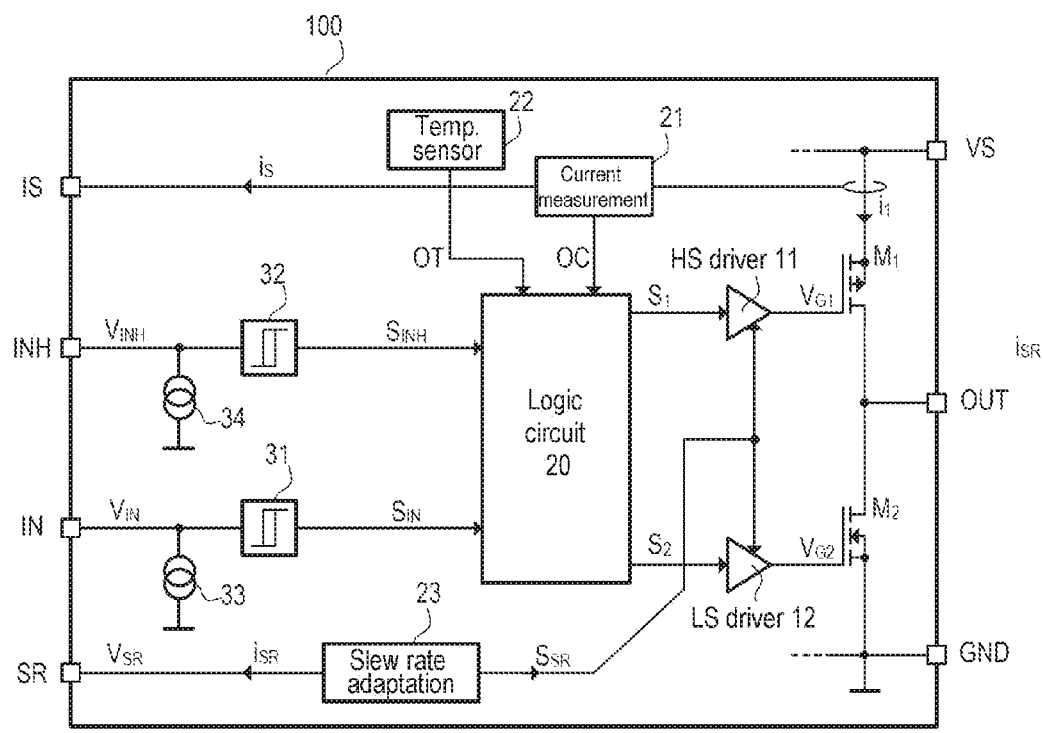
FIG. 2 illustrates one exemplary implementation of the intelligent semiconductor switch from FIG. 1.

One example of a known intelligent semiconductor switch is the component BTN8962TA from Infineon (High Current PN Half Bridge NovalithIC™), which substantially comprises (besides a few peripheral component parts) a transistor half-bridge and an integrated drive circuit. FIG. 2 is a simplified block diagram for illustrating one example of an intelligent semiconductor switch, wherein those component parts which are not necessary for the further discussion have been omitted for the sake of simplicity.

In accordance with FIG. 2, the intelligent semiconductor switch comprises a transistor half-bridge constructed from the transistors $M_1$ and $M_2$, wherein $M_1$ represents the high-side transistor and $M_2$ represents the low-side transistor of the half-bridge. The high-side transistor $M_1$ is connected between the supply pin VS and the output pin OUT, and the low-side transistor $M_2$ is connected between the output pin OUT and the supply pin GND (ground pin). The transistors $M_1$ and $M_2$ can be MOSFETs having an intrinsic body diode (not illustrated in FIG. 2). The control signals $V_{G1}$, $V_{G2}$ (gate voltages) for driving the gates of the transistors $M_1$ and $M_2$ are generated by the drive circuit mentioned. In the example illustrated, the drive circuit comprises for this purpose the gate drivers 11 and 12, which generate the control signals $V_{G1}$, $V_{G2}$ for the transistors $M_1$ and $M_2$, respectively, depending on the logic signals $S_1$ and $S_2$. For generating the logic signals $S_1$ and $S_2$, the drive circuit comprises a logic circuit 20. In the example illustrated, the low-side transistor $M_2$ is of the n-channel type and the high-side transistor $M_1$ is of the p-channel type. This is not necessarily the case, however, and—depending on the concrete implementation—it is also possible for both transistors $M_1$ and $M_2$ to be of the n-channel type.

The logic circuit 20 is configured to generate the logic signals $S_1$ and $S_2$ for the gate drivers 11 and 12 in accordance with the logic signals $S_{IN}$ and $S_{INH}$, which represent the logic levels of the control signals $V_{IN}$ and $V_{INH}$ present at the pins IN and INH, respectively. The control signal $V_{IN}$ received at the pin IN is fed to a comparator 31, at the output of which the logic signal $S_{IN}$ is output to the logic circuit. The comparator 31 can be e.g. a type of Schmitt trigger having two switching thresholds in order to identify an input voltage $V_{IN}$ of above 1.6 V as a high level (logic level $S_{IN}=1$) and to identify an input voltage $V_{IN}$ of below 1.4 V as a low level (logic level $S_{IN}=0$), wherein the permissible voltage range for the input voltage $V_{IN}$ can be for example between −0.3 V and +5.3 V. The input of the comparator 11 can be connected to a pull-down current source 33 or alternatively to a pull-down resistor in order to pull the level of the input voltage $V_{IN}$ toward zero, provided that some other input voltage level is not actively applied (e.g. by an external microcontroller). The comparator 32 and the pull-down current source 34 have substantially the same function as the comparator 31 and the current source 33, the comparator 32 generate the logic signal $S_{INH}$ from the voltage $V_{INH}$ received at the pin INH. It goes without saying that in other exemplary embodiments the current sources 33 and 34 can also be omitted or can be replaced by pull-down resistors connected externally to the intelligent semiconductor switch 100. The abovementioned numerical values for the voltage $V_{IN}$ should be understood merely as illustrative examples and may be different in other implementations.

In accordance with one exemplary embodiment, the logic circuit 20 can be configured to generate the logic signals $S_1$ and $S_2$ for the gate drivers 11 in accordance with the following equation: $S_1=S_{IN} \wedge S_{INH}$, and $S_2=\neg S_1$. In this case, the operator $\wedge$ denotes a logic AND operation and the operator $\neg$ denotes a logic negation (inversion). It goes without saying that the logic equations mentioned must be regarded as a simplified representation that disregards functions such as an overcurrent shutdown and an overtemperature shutdown. In many exemplary embodiments, the logic circuit 20 will be more complex.

In the exemplary embodiment illustrated in FIG. 2, the intelligent semiconductor switch 100 includes a temperature sensor circuit 22 configured to generate an overtemperature signal OT if the measured chip temperature exceeds a temperature threshold value. The intelligent semiconductor switch 100 further includes a current sensor circuit 21 configured to generate an overcurrent signal OC if the load current it through the high-side transistor $M_1$ exceeds a current threshold value. The signals OT and OC are fed to the logic circuit 20 and the latter is then configured to deactivate (switch off) the transistors M1 and M2 of the half-bridge or to prevent an activation (switch-on) if the signal OT indicates an overtemperature or if the signal OC indicates an overcurrent. In accordance with one exemplary embodiment, in the case of a detected overtemperature or a detected overcurrent, the half-bridge remains detected until the inhibit signal $V_{IN}$ changes (again) from a low level to a high level. It goes without saying, however, that overtemperature and overcurrent events are handled differently in other exemplary embodiments by comparison with the example from FIG. 2.

Furthermore, the exemplary embodiment in accordance with FIG. 2 affords the possibility of setting the switching rate (slew rate) of the transistors (within certain limits). As already mentioned further above, in the example from FIGS. 1 and 2, the switching rate is set on the basis of a voltage signal $V_{SR}$ present at the pin SR, wherein the level of the signal $V_{SR}$ is determined by an external resistor $R_{SR}$ connected between the pin SR and the reference potential $V_{SS}$ (ground). For this purpose, the intelligent semiconductor switch can comprise a slew rate adapting circuit 23, which outputs a constant current $i_{SR}$ at the pin SR, with the result that the voltage $V_{SR}=i_{SR} \cdot R_{SR}$ is present at the pin. The slew rate adapting circuit 23 is further configured to drive the gate drivers (see FIG. 2, slew rate control signal SSR) on the basis of the voltage level $V_{SR}$ such that the desired switching rate or the desired slew rate is achieved. A suitable slew rate adapting circuit 23 is known per se and contained for example in the component BTN8962TA mentioned above.

In the example from FIG. 2, the current sensor circuit 21 is configured to output at the pin IS a measurement signal (e.g. a current signal is) representing the load current $i_1$ through the high-side transistor M. The overcurrent signal OC shown in FIG. 2 can be generated e.g. by virtue of the fact that the current signal is (or a corresponding voltage signal) is compared with a threshold value by means of a comparator. The current sensor circuit 21 can be implemented in various ways. For the current measurement, for example, a so-called sense FET can be used, which is coupled to the high-side transistor $M_1$ in a manner similar to a current mirror and is configured to output a current that is substantially proportional to the load current $i_1$. Other possibilities for the current measurement such as e.g. the use of a current measuring resistor are likewise possible.

Figure 3:
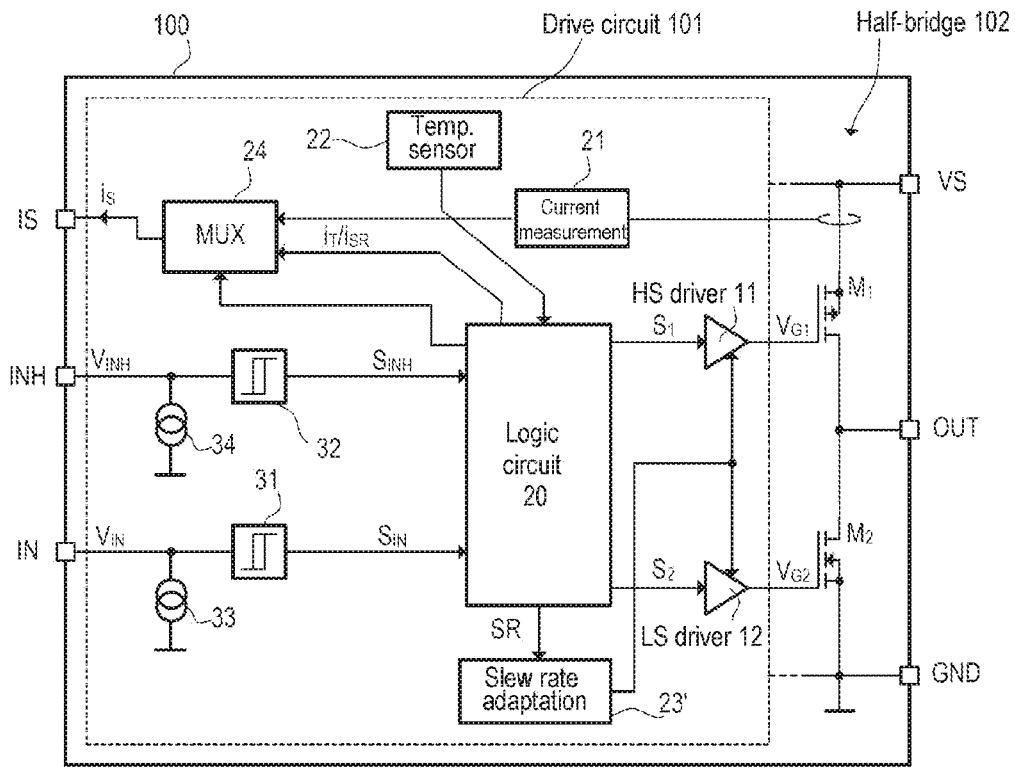
FIG. 3 illustrates one exemplary embodiment of an intelligent semiconductor switch which requires one pin fewer than in the example from FIG. 2.

The exemplary embodiment illustrated in FIG. 3 is very similar to the previous example from FIG. 2. Essentially the differences between the examples from FIGS. 2 and 3 are discussed below. One pin fewer is required in the case of the exemplary embodiment from FIG. 3. In comparison with the previous example, the pin SR for setting operating parameters such as slew rate is not present in FIG. 3. Instead, the input pin IN can be used to read in one or a plurality of operating parameters, wherein the reading in of the operating parameter(s) can be carried out for example in those time intervals during which the output of the intelligent semiconductor switch is inactive on account of the (e.g. low) level of the control voltage $V_{INH}$ at the pin INH (inhibit signal). The intelligent semiconductor switch 100 contains a drive circuit 101 comprising a logic circuit 20 configured to identify the operating parameter input via the pin IN and – in the case of the slew rate—to output the detected parameter in a suitable form (parameter SR) to the slew rate adapting circuit 23. The circuit 23 (like the circuit 23 in the previous example) then drives the gate drivers 11 and 12 depending on the received parameter SR such that the switching edges of the gate drivers 11, 12 have the desired slew rate (corresponding to the parameter SR). One example of how the parameter SR can be read in will be described later with reference to FIGS. 4 and 5.

Unlike in the previous example from FIG. 2, the drive circuit 101 of the intelligent semiconductor switch 100 from FIG. 3 comprises a multiplexer 24, which makes it possible also to output still other values at the pin IS besides the current measurement signal supplied by the current measuring circuit 21. In the present example, the logic circuit 20 can be configured to provide a current (e.g. by means of a digital-to-analog convertor with current output) representing e.g. the measured temperature (current signal $i_T$) or a currently set operating parameter (e.g. slew rate) (current signal $i_{SR}$). By way of a control signal, the logic circuit 20 can drive the multiplexer to output a desired measurement signal at the pin IS. In some exemplary embodiments, an offset current Ios can always be superposed on the current output at the pin IS. It goes without saying that this however depends on the concrete implementation and need not necessarily be the case.

Figure 4:
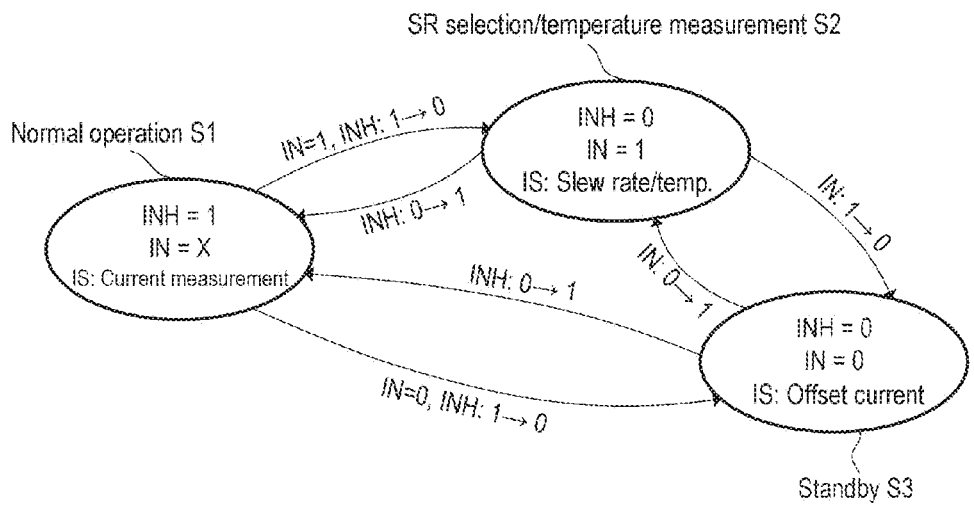
FIG. 4 is a state diagram of a Finite State Machine (FSM) representing the function of the logic circuit contained in the example from FIG. 3.

The logic circuit 20 can implement a finite state machine (FSM). The function of FSMs can be represented by a state diagram. FIG. 4 shows—in a simplified form—a state diagram representing the function of the logic circuit 20 and of the intelligent semiconductor switch overall. The associated signal waveforms are illustrated by way of example in timing diagrams in FIG. 5.

The states "Normal operation" (state S1), "SR selection/ temperature measurement" (state $S_2$) and "Standby" (state S3) are differentiated in accordance with FIG. 4. It goes without saying that this is a simplified illustration and the individual states can be subdivided even further upon closer consideration. However, the simplified illustration in accordance with FIG. 4 is sufficient for the following discussion. The state S1 (Normal operation) is defined by the fact that a logic value "1" is signaled to the logic circuit 20 by the control voltage $V_{INH}$ at the pin INH (symbolized by "INH=1" in FIG. 4). In this state, the high-side transistor $M_1$ is conducting if at the input pin IN the input voltage $V_{IN}$ represents a logic value "1" (e.g. high level), and the low-side transistor $M_2$ is conducting if at the input pin IN the input voltage $V_{IN}$ represents a logic value "0" (e.g. low level). It goes without saying that the low-side transistor $M_2$ is switched off if the high-side transistor $M_1$ is conducting, and vice versa, such that both transistors of the half-bridge are never conducting simultaneously. In the state S1 (Normal operation), the current output at the pin IS represents the load current $i_1$ through the high-side transistor. In other exemplary embodiments, the current output at the output pin OUT is measured instead of the current $i_1$.

If the control voltage $V_{INH}$ (inhibit signal) changes its level and a logic value "0" (e.g. high level), the FSM changes to the state S3 if the input voltage $V_{IN}$ likewise represents a logic "0" ($V_{IN}$ at low level, symbolized by "IN=0" in FIG. 4), or to the state S2 if the input voltage $V_{IN}$ represents a logic "1" (V at high level, symbolized by "IN=1" in FIG. 4). In the state S3 (Standby), the output of the half-bridge is at high impedance and only the offset current $i_{OS}$ is output at the pin IS ($i_S=i_{OS}$), wherein the offset current can also be zero. In the state S2, a current is indicating the currently chosen slew rate value ($i_S=i_{SR}$) or the measured chip temperature ($i_S=i_T$) is output at the pin IS. The actual value of the current is depends on how often a change has been made to the state S2 since the state S1 (Normal operation) was left. Expressed in a general way, the actual value of the current is depends on a pulse pattern of the input voltage $V_{IN}$ (also see FIG. 5).

Figure 5:
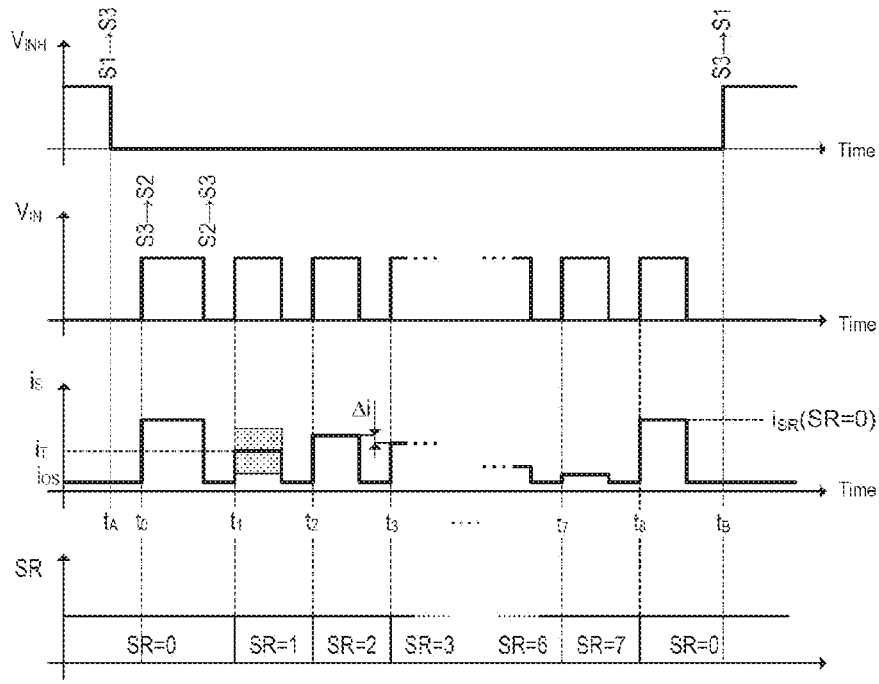
FIG. 5 contains timing diagrams for further illustration of the function of the intelligent semiconductor switch from FIG. 3.

The function of an intelligent semiconductor switch in accordance with FIG. 3 with an FSM (logic circuit 20) in accordance with FIG. 4 is elucidated further with reference to the timing diagrams from FIG. 5. The first timing diagram (from top) shows an exemplary profile of the voltage $V_{INH}$ (Inhibit signal) at the pin INH. Firstly, the FSM is in the state S1 (Normal operation) and changes to the state S3 (Standby) at the point in time $t_A$. Later, at the point in time $t_B$, the FSM changes again to the state S1 (Normal operation). The second timing diagram illustrates an exemplary profile of the input voltage $V_{IN}$ (input signal) at the pin IN. With every rising edge (i.e. change from a low level to a high level) in the input voltage $V_{IN}$, the FSM changes from the state S3 (Standby) to the state S2 (SR selection/temperature measurement), and with every falling edge (i.e. change from a high level to a low level) in the input voltage $V_{IN}$, the FSM changes back to the state S3. In the state S3, only the offset current $i_S=i_{OS}$ is output at the pin IS. In the state S2, a current representing either a currently set operating parameter value (i.e. slew rate in the present example) or a measured chip temperature is output at the pin IS. One example of the current output at the pin IS is in the third timing diagram in FIG. 5. The currently set parameter representing the desired slew rate can be seen in the fourth timing diagram. In the present example, eight different values can be set for the parameter SR (slew rate) (from SR=0 to SR=7).

In accordance with FIG. 5, the input voltage $V_{IN}$ has rising edges (transition to state S2) at the points in time $t_0$, $t_2$, $t_4$, $t_6$, $t_8$. The current output at the pin IS in the state S2 depends on how often the input voltage $V_{IN}$ has changed to the state S2 since the state S1 (Normal operation) was ended (i.e. since the point in time $t_A$). Upon the first transition to the state S2 (Point in time $t_0$), a current $i_S=i_{SR}$ (SR=0) representing the currently set parameter value (SR=0 in the present example) is output at the pin IS. Upon each following transition to the state S2 (Points in time $t_1$ to $t_8$), the parameter value is incremented by one. In the case of a parameter value SR=7, "increment by one" means a change from SR=7 to SR=0, that is to say that an overflow from the highest value to the lowest value takes place. Starting from the third transition to the state S2 (Point in time $t_2$), the currently set parameter value SR is output (as it were as "Feedback"), wherein the magnitude of the current $i_S=i_{SR}$ indicates the currently selected parameter value. At the second transition to the state S2 (Point in time $t_1$)—provided that the intelligent semiconductor switch measures a chip temperature—a current $i_S=i_T$ representing the measured temperature can be output instead of a current representing the parameter value. The parameter value SR set is thus dependent on the pulse pattern of the input voltage $V_{IN}$. In the simplest case, it is possible—e.g. by an external controller—by means of applying an input voltage $V_{IN}$ at the pin IN with only two pulses (at the points in time $t_0$ and $t_1$), to interrogate the currently set parameter value SR and to measure the currently measured chip temperature. As soon as the voltage $V_{INH}$ changes to a high level again, the FSM changes to the state S1 (Normal operation), in which the voltage $V_{IN}$ defines the switching state of the half-bridge.

Figure 6:
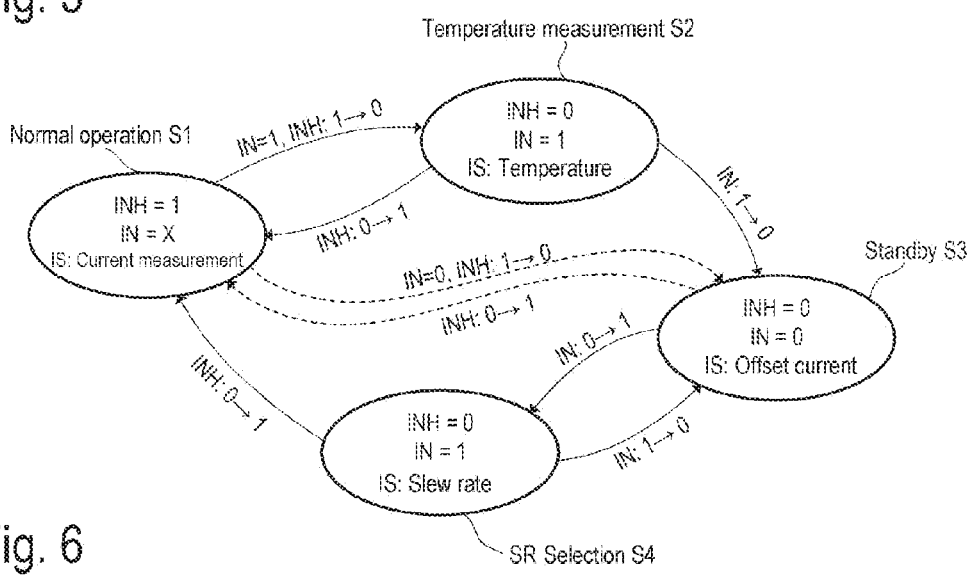
FIG. 6 is a state diagram of a Finite State Machine (FSM) representing the function of the logic circuit in accordance with a further exemplary embodiment.

FIG. 6 illustrates a further exemplary embodiment of an FSM, this exemplary embodiment enabling additional functionality of the intelligent semiconductor switch. Unlike in the previous example from FIG. 4, temperature measurement and parameter selection are realized as separate states S2 and S4, which may be advantageous for some applications. FIG. 6 shows—in a manner similar to FIG. 4—a simplified state diagram representing the function of the logic circuit 20 and thus of the intelligent semiconductor switch overall. The associated signal waveforms for various applications are illustrated by way of example in FIGS. 7 and 8.

The states "Normal operation" (state S1), "Temperature measurement" (state S2), "Standby" (state S3) and "SR selection" (state S4) are differentiated in accordance with FIG. 6. As mentioned, the state diagram is a simplified illustration, and the individual states can be subdivided even further upon closer consideration. However, the simplified illustration in accordance with FIG. 6 is sufficient for the following discussion. The state S1 (Normal operation) is defined—as in the example from FIG. 4—by the fact that a logic value "1" is signaled to the logic circuit 20 by the control voltage $V_{INH}$ at the pin INH (symbolized by "INH=1" in FIG. 6). In this state, the high-side transistor $M_1$ is conducting if at the input pin IN the input voltage $V_{IN}$ represents a logic value "1" (e.g. high level), and the low-side transistor $M_2$ is conducting if at the input pin IN the input voltage $V_{IN}$ represents a logic value "0" (e.g. low level). It goes without saying that the low-side transistor $M_2$ is switched off if the high-side transistor $M_1$ is conducting, and vice versa, such that both transistors of the half-bridge are never conducting simultaneously. In the state S1 (Normal operation), the current output at the pin IS represents the load current $i_1$ through the high-side transistor. In other exemplary embodiments, the current output at the output pin OUT can be measured instead of the current $i_1$.

If the control voltage $V_{INH}$ (inhibit signal) changes its level and a logic value "0" (e.g. high level), the FSM changes to the state S3 if the input voltage $V_{IN}$ likewise represents a logic "0" ($V_{IN}$ at low level, symbolized by "IN=0" in FIG. 6), or to the state S2 if the input voltage $V_{IN}$ represents a logic "1" ($V_{IN}$ at high level, symbolized by "IN=1" in FIG. 6). In the state S3 (Standby), the output of the half-bridge is at high impedance and only the offset current $i_{OS}$ is output at the pin IS ($i_S=i_{OS}$), wherein the offset current can also be zero. In the state S2, a current is indicating the measured chip temperature ($i_S=i_T$) is output at the pin IS (cf. FIG. 3, temperature sensor 22). In the state S2, a change in the logic level of the input voltage $V_{IN}$ from "1" to "0" brings about a transition to the Standby mode S3, in which—as in the example from FIG. 4—only an offset current $i_S=i_{OS}$ is output at the output IS, which offset current can also be zero.

In the state S3, an operating parameter SR (for example a slew rate) can be set with one or more changes to the state S4, wherein the selected parameter is dependent on the pulse pattern at the input pin IN. By way of example, the selected operating parameter depends on how often the level of the input voltage $V_{IN}$ changes. One example of the selection of a desired operating parameter SR will be explained in even greater detail later with reference to FIG. 8. In the exemplary embodiments described here, upon every change from the state S3 to the state S4, the operating parameter SR is incremented by one, wherein an overflow takes place when the highest parameter value (e.g. SR=7) is incremented, the smallest parameter value (e.g. SR=0) being obtained as the result of this. In the state S4, a current is representing the currently selected parameter value is output at the pin IS. In this state, the current is can be regarded as a feedback signal that reports the currently selected operating parameter back to an external controller. In the states S2, S3 and S4, a change in the logic level of the control voltage $V_{INH}$ (Inhibit signal) brings about a transition to the state S1 (Normal operation).

Figure 7:
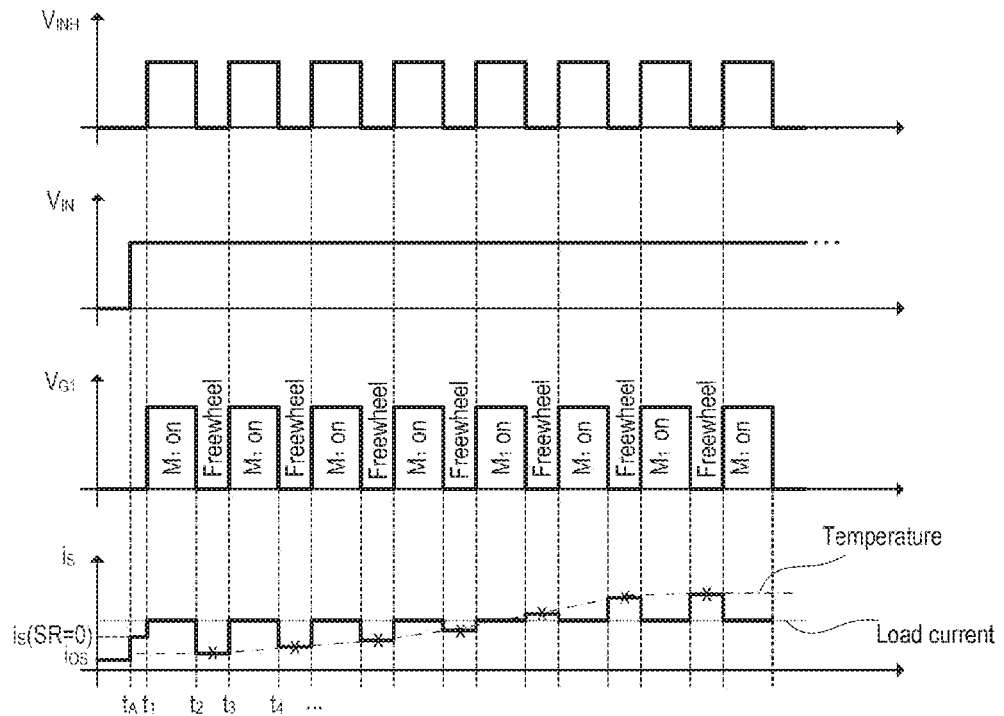
FIGS. 7 and 8 contain timing diagrams for further illustration of an intelligent semiconductor switch with a Finite State Machine (FSM) in accordance with FIG. 6.

Two different applications are explained in greater detail below by way of example with reference to the timing diagrams from FIGS. 7 and 8. The timing diagrams illustrate by way of example the function of an intelligent semiconductor switch in accordance with FIG. 3 with an FSM (logic circuit 20) in accordance with FIG. 6. In FIG. 7, the first timing diagram (from the top) shows an exemplary profile of the voltage $V_{INH}$ (Inhibit signal) at the pin INH. The second timing diagram shows an exemplary profile of the input voltage $V_{IN}$ at the pin IN. The third timing diagram shows the associated profile of the gate voltage $V_{G1}$ of the high-side switch $M_1$ (which is an n-channel MOSFET in this example), and the fourth timing diagram shows the associated output current is at the pin IS.

Firstly, the FSM is in the state S3 (Standby). At the point in time $t_4$, the input voltage $V_{IN}$ changes from "0" to "1" (logic level) and the FSM thus undergoes transition to the state S4, and the output current is at the pin IS represents the currently selected operating parameter SR. In this example, the input voltage $V_{IN}$ remains at a logic level "1" starting from the point in time $t_4$. Starting from the point in time $t_1$, the voltage $V_{INH}$ (Inhibit signal) at the pin INH changes periodically from "0" to "1" and back again from "1" to "0" (logic level). The rising edge occurs at the point in time $t_1$, and the succeeding falling edge occurs at the point in time $t_2$. The next period begins at the point in time $t_3$ with the next rising edge (corresponding falling edge at the point in time $t_4$).

With each level change in the inhibit signal $V_{INH}$ (or $S_{INH}$, see FIG. 3), the FSM changes to the state S1 (in the case of rising edges at the points in time $t_1$, $t_3$, ...) or to the state S2 (in the case of falling edges at the points in time $t_2$, $t_4$, ...). In the state S1 (Normal operation), the high-side transistor $M_1$ is actively switched on (gate voltage $V_{G1}$ is at a high level, above the threshold voltage of the transistor), whereas in the state $S_2$ (Standby) the half-bridge is passive, i.e. the transistors $M_1$ and $M_2$ are both switched off, but a freewheel via the intrinsic body diode (not illustrated in FIG. 3) of the low-side transistor $M_2$ is possible. At the same time, in the state S2, a current $i_S = i_T$ representing the measured chip temperature is output at the pin IS. In the example illustrated in FIG. 7 the temperature can thus be measured quasi-continuously; a temperature measurement value is obtained in each switching cycle. In the bottommost diagram in FIG. 7, the points in time at which e.g. an external controller can sample the current is (and thus the temperature information) are marked with an "x". While the FSM is in the state S1, the current is represents the load current through the high-side transistor $M_1$, which is likewise accessible to a measurement (e.g. by an external controller). In the example from FIG. 7, the load current remains substantially constant while the chip temperature rises.

Figure 8:
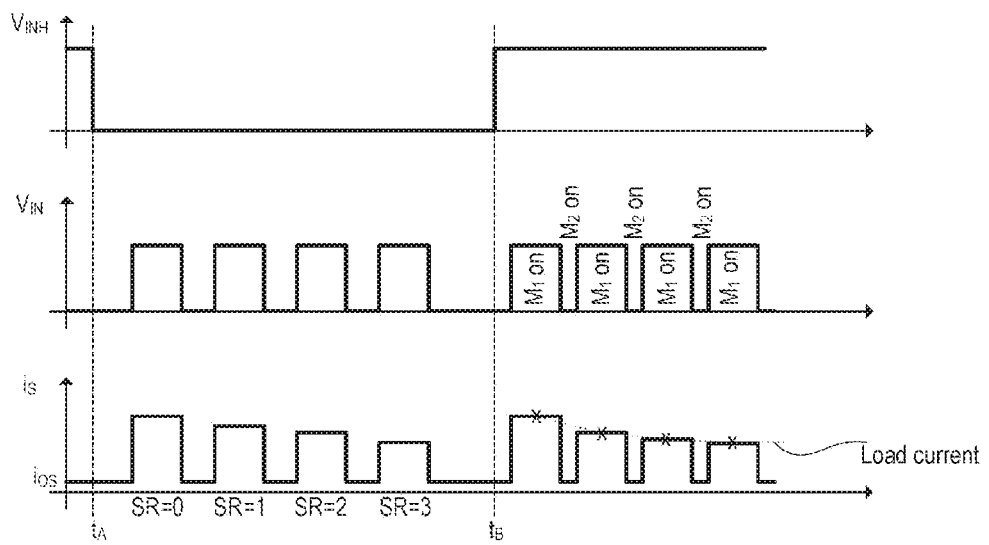

FIG. 8 relates to another application, in which an operating parameter SR of the intelligent semiconductor switch (e.g. the slew rate during a switching process) is selected and set before the start of normal operation. In FIG. 8, the first timing diagram (from the top) shows an exemplary profile of the voltage $V_{INH}$ (Inhibit signal) at the pin INH. The second timing diagram shows an exemplary profile of the input voltage $V_{IN}$ at the pin IN, and the third timing diagram shows the associated output current is at the pin IS. The example illustrated begins in normal operation (state S1 of the FSM from FIG. 6), and at the point in time $t_4$ the logic level of the voltage $V_{INH}$ changes from "1" to "0" and the FSM changes to the state S3 (Standby), while the offset current $i_S = i_{OS}$ is output at the pin IS. Proceeding from state S3, an operating parameter S3 can be set by virtue of the fact that an input signal $V_{IN}$ having a specific pulse pattern, i.e. a specific sequence of logic levels or a specific sequence of level changes, is applied to the pin IN. Upon every change in the logic level of the input signal $V_{IN}$ from "0" to "1" (rising edge), the FSM changes to the state S4 (SR selection), and upon every change in the logic level of the input signal $V_{IN}$ from "1" to "0" (falling edge), the FSM changes back to the state S3 (Standby). In the example illustrated, the selected operating parameter SR depends on how often a rising edge was identified in the input signal $V_{IN}$, i.e. how often the FSM has changed from the state S3 to the state S4.

In the state S4, a current is representing the currently selected/set operating parameter SR is output as feedback signal at the pin IS. At the point in time $t_B$, the logic level of the inhibit signal $V_{INH}$ changes from "0" to "1", and the FSM thus undergoes transition to normal operation (active operating mode, state S1), in which, as already explained, the input signal $V_{IN}$ defines the switching state of the half-bridge and a current is representing the current through the high-side transistor $M_1$ of the half-bridge (cf. FIG. 3) is output at the pin IS.

FIGS. 7 and 8 show two distinctly different applications of the same intelligent semiconductor switch. In the example in accordance with FIG. 7, only the high-side switch $M_1$ of the half-bridge is actively switched on and off, while the low-side switch $M_2$ is not actively switched on, rather only its intrinsic body diode can carry current when the high-side switch $M_1$ is switched off. Switching operation is controlled in practice by way of the inhibit signal $V_{INH}$, which can be pulse-width modulated, for example. Temperature measurement and current measurement are effected virtually simultaneously and current information and temperature information are output alternately at the pin IS, with the result that at least one current measurement value and at least one temperature measurement value can be sampled in each PWM cycle. In the example from FIG. 8, in normal operation (normal mode, starting from the point in time t), both transistors $M_1$ and $M_2$ of the half-bridge are actively driven in accordance with the input signal $V_{IN}$. A temperature measurement is possible in this case only upon interruption of the normal mode.

In both exemplary embodiments of the FSM (see FIG. 4 and FIG. 6), the state S1 (Normal operation) can be assigned to a first, active (operating) mode of the intelligent semiconductor switch, in which the half-bridge is actively driven. The remaining states can be assigned to a second, passive mode of the intelligent semiconductor switch. In this mode, the half-bridge is not actively driven, but a temperature measurement and a setting of one or more operating parameters are possible.

It should also be noted at this juncture that the logic levels ("0" and "1") mentioned are dependent on the actual implementation. Depending on the implementation of the intelligent semiconductor switch, one or a plurality of signals can use inverted logic levels. The description above has not always drawn a distinction between the signals $V_{INH}$ and $S_{INH}$ and $V_{IN}$ and $S_{IN}$ (see FIG. 3). This distinction is not actually necessary for the exemplary embodiments described because both signals $V_{INH}$ and $S_{INH}$, and $V_{IN}$ and $S_{IN}$ represent the same information.

Figure 9:
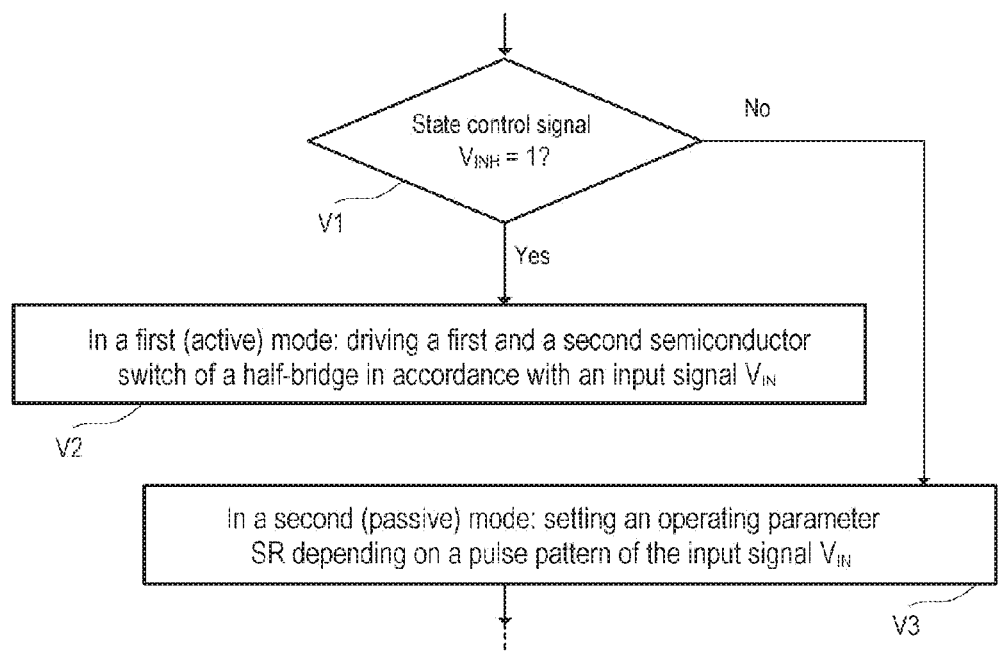
FIG. 9 is a flow diagram for illustrating a method for operating an intelligent semiconductor switch.

FIG. 9 is a flow diagram for illustrating one exemplary embodiment of a method for operating an intelligent semiconductor switch and for further illustration of the function of the example from FIG. 3. In accordance with FIG. 9, the intelligent semiconductor switch can be operated in a first mode (active mode) and a second mode (passive mode). The intelligent semiconductor switch operates in the active mode if a state control signal (see FIG. 3, signals $V_{INH}$ and $S_{INH}$, respectively) having a first logic level (e.g. a high level) is received at a control terminal (see FIG. 3, pin INH) of the chip package. Equally, the intelligent semiconductor switch operates in the passive mode if the state control signal has a second logic level (e.g. a low level) (see FIG. 9, step V1).

In the first, active mode, the method comprises driving a first and a second semiconductor switch (cf. FIG. 3, $M_1$, $M_2$) of a half-bridge in accordance with an input signal (see FIG. 9, step V2) received at an input terminal (cf. FIG. 3, pin IN) of the chip package (also see FIG. 8, after the point in time $t_B$). In the second, passive mode, the method comprises setting an operating parameter (see FIG. 9, step V3) depending on a pulse pattern of the input signal received at the input terminal (also see FIG. 7 and FIG. 8, time interval $t_A$ to $t_B$). The first, active mode substantially corresponds to the state S1 of the FSM (Normal operation, Normal mode, see FIGS. 4 and 6). The second, passive mode encompasses the remaining states S2 and S3 and, if appropriate, S4. In this passive mode, the electrical potential at the output node of the half-bridge (cf. FIG. 3, output PIN OUT) is dependent on the load (and the state thereof) and, as mentioned, a freewheel through the intrinsic body diodes of the transistors $M_1$ and $M_2$ is possible.

The invention claimed is:

1. A semiconductor component comprising:
   a half-bridge including a first semiconductor switch and a second semiconductor switch, which are both connected to a half-bridge output node;
   a logic circuit configured to provide control signals for the first semiconductor switch and the second semiconductor switches;
   an output terminal connected to the half-bridge output node; and
   a control terminal for receiving a state control signal and an input terminal for receiving an input signal;
   wherein the logic circuit is configured:
   in a first mode, in which the state control signal has a first logic level, to generate the control signals for the first and second semiconductor switches in accordance with the input signal; and,
   in a second mode, in which the state control signal has a second logic level, to generate a further signal to set an operating parameter of the half-bridge based on a pulse pattern of the input signal received at the input terminal, wherein the operating parameter defines one of a switching rate, an overtemperature limit, or a temperature threshold value of the half-bridge.

2. The semiconductor component according to claim 1, further comprising:
   a driver circuit configured to generate a drive signal based on the input signal received at the input terminal and the operating parameter, said drive signal being fed to the first semiconductor switch.

3. The semiconductor component according to claim 2, wherein the operating parameter defines the switching rate of the half-bridge.

4. The semiconductor component according to claim 1, further comprising:
   a temperature sensor circuit configured to generate a temperature measurement signal representing a temperature associated with the half-bridge,
   a current sensor circuit configured to generate a current measurement signal representing a current through one of the semiconductor switches, and
   a further terminal, which is coupled to the current sensor circuit and the temperature sensor circuit via a selection circuit,
   wherein the logic circuit is configured to drive the selection circuit in the first mode such that the current measurement signal is output at the further terminal and either the temperature measurement signal or an operating parameter signal representing the operating parameter is output in the second mode.

5. The semiconductor component according to claim 4, wherein after a change to the second mode at the further terminal the temperature measurement signal is output and then the operating parameter signal representing the operating parameter is output, depending on how often a logic level of the input signal changes.

6. A method for operating an intelligent semiconductor switch integrated in a chip package, the method comprising:
   driving a first semiconductor switch and a second semiconductor switch of a half-bridge in accordance with an input signal, which is received at an input terminal of the chip package, in a first mode, in which a first state control signal having a first logic level is received at a control terminal of the chip package;
   generating a further signal to set an operating parameter of the half-bridge based on a pulse pattern of the input signal received at the input terminal in a second mode, in which a second state control signal having a second logic level is received at the control terminal of the chip package, wherein the operating parameter defines one of a switching rate, an overtemperature limit, or a temperature threshold value of the half-bridge.

7. The method according to claim 6, wherein a current measurement signal representing a current through one of the semiconductor switches is output at a further terminal in the first mode.

8. The method according to claim 6, wherein either a temperature measurement signal or an operating parameter signal representing the operating parameter is output at a further terminal in the second mode, depending on the pulse pattern of the input signal received at the input terminal.

9. The method according to claim 8, wherein after a change to the second operating mode, firstly the temperature measurement signal is output at the further terminal and then, after an edge in the input signal, the operating parameter signal representing the operating parameter is output.

* * * * *